(12) United States Patent
Ueyama et al.

(10) Patent No.: US 10,014,432 B2
(45) Date of Patent: Jul. 3, 2018

(54) MANUFACTURING METHOD FOR SOLAR CELL

(71) Applicant: Panasonic Intellectual Property Management Co., Ltd., Osaka (JP)

(72) Inventors: Tomonori Ueyama, Osaka (JP); Motohide Kai, Osaka (JP); Masaki Shima, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 15/054,129

(22) Filed: Feb. 25, 2016

(65) Prior Publication Data

US 2016/0181461 A1 Jun. 23, 2016

Related U.S. Application Data

(60) Division of application No. 14/090,405, filed on Nov. 26, 2013, which is a continuation of application No. PCT/JP2012/062327, filed on May 14, 2012.

(30) Foreign Application Priority Data

Jun. 6, 2011 (JP) .................. 2011-126232
Jun. 6, 2011 (JP) .................. 2011-126233
Jun. 6, 2011 (JP) .................. 2011-126234

(51) Int. Cl.
| | | |
|---|---|---|
| *H01L 21/00* | (2006.01) | |
| *H01L 31/18* | (2006.01) | |
| *H01L 31/0747* | (2012.01) | |
| *H01L 31/075* | (2012.01) | |
| *H01L 31/068* | (2012.01) | |
| *H01L 31/0376* | (2006.01) | |

(52) U.S. Cl.
CPC .... *H01L 31/1804* (2013.01); *H01L 31/03762* (2013.01); *H01L 31/0682* (2013.01); *H01L 31/075* (2013.01); *H01L 31/0747* (2013.01); *H01L 31/186* (2013.01); *H01L 31/1868* (2013.01); *Y02E 10/547* (2013.01); *Y02P 70/521* (2015.11)

(58) Field of Classification Search
CPC . H01L 31/186; H01L 31/1868; H01L 31/075; H01L 31/0747
See application file for complete search history.

(56) References Cited

U.S. PATENT DOCUMENTS

| | | | |
|---|---|---|---|
| 8,631,762 B2 | 1/2014 | Yamamuka et al. | |
| 2006/0024442 A1* | 2/2006 | Ovshinsky | C23C 16/24 427/255.5 |
| 2008/0261348 A1* | 10/2008 | Terakawa | C23C 16/0272 438/96 |

(Continued)

FOREIGN PATENT DOCUMENTS

| | | | |
|---|---|---|---|
| JP | 2005-154795 A | | 6/2005 |
| JP | 2005154795 A | * | 6/2005 |
| WO | 2010-050363 A1 | | 5/2010 |

*Primary Examiner* — Syed Gheyas
(74) *Attorney, Agent, or Firm* — Metrolexis Law Group, PLLC

(57) ABSTRACT

Provided is a method for manufacturing a solar cell with improved output characteristics. A hydrogen radical treatment, in which ions are not used, is performed on at least one of the first and second semiconductor layers (11, 13).

4 Claims, 2 Drawing Sheets

(56) References Cited

U.S. PATENT DOCUMENTS

| | | | |
|---|---|---|---|
| 2011/0000532 A1* | 1/2011 | Niira | H01L 31/0747 136/255 |
| 2011/0177644 A1 | 7/2011 | Yamamuka et al. | |
| 2011/0207261 A1* | 8/2011 | Watai | C23C 14/042 438/98 |
| 2012/0282742 A1* | 11/2012 | Matsuda | H01L 21/02532 438/151 |

* cited by examiner

MANUFACTURING METHOD FOR SOLAR CELL

CROSS-REFERENCE TO RELATED APPLICATIONS

This application is a divisional of application Ser. No. 14/090,405, filed on Nov. 26, 2013, which is a continuation application of International Application No. PCT/JP2012/062327, filed on May 14, 2012, entitled "MANUFACTURING METHOD FOR SOLAR CELL" which claims priority based on Article 8 of Patent Cooperation Treaty from prior Japanese Patent Application Nos. 2011-126232, 2011-126233 and 2011-126234, all of them filed on Jun. 6, 2011, the entire contents of which are incorporated herein by reference.

FIELD OF THE INVENTION

The present invention relates to a manufacturing method for a solar cell.

BACKGROUND

Conventionally, solar cells are known to have, for example, an n-type semiconductor substrate and a p-type semiconductor layer arranged on the semiconductor substrate. As is well known, carrier recombining can be suppressed in these solar cells by introducing hydrogen to the semiconductor layer to reduce the density of defects in the semiconductor layer. Also, the bandgap energy of the semiconductor layer can be increased and light-absorption loss reduced by introducing hydrogen to the semiconductor layer and increasing the number of hydrogen atoms bonded to silicon atoms.

A method for introducing hydrogen to a semiconductor layer is described in Patent Document 1. In this method, the semiconductor layer is irradiated with hydrogen ions which have been accelerated by an electric field to which an acceleration voltage of approximately 1 eV to 5 keV has been applied.

PRIOR ART DOCUMENTS

Patent Documents

Patent Document 1: Laid-Open Patent Publication No. 2004-289058

SUMMARY

Problem Solved by the Invention

However, solar cells with improved output characteristics are increasingly desired.

In view of this desire, it is an object of the present invention to provide a method for manufacturing solar cells with improved output characteristics.

Means of Solving the Problem

In the manufacturing method for a solar cell according to the present invention, a first semiconductor layer of one type of conductivity is formed on the first main surface of a semiconductor substrate of the one type of conductivity. A second semiconductor layer of the other type of conductivity is formed on the second main surface of the semiconductor substrate. Hydrogen radical treatment, in which ions are not used, is performed on at least one of the first and second semiconductor layers.

Effect of the Invention

The present invention is able to provide a method for manufacturing solar cells with improved output characteristics.

DETAILED DESCRIPTION

Figure 1:
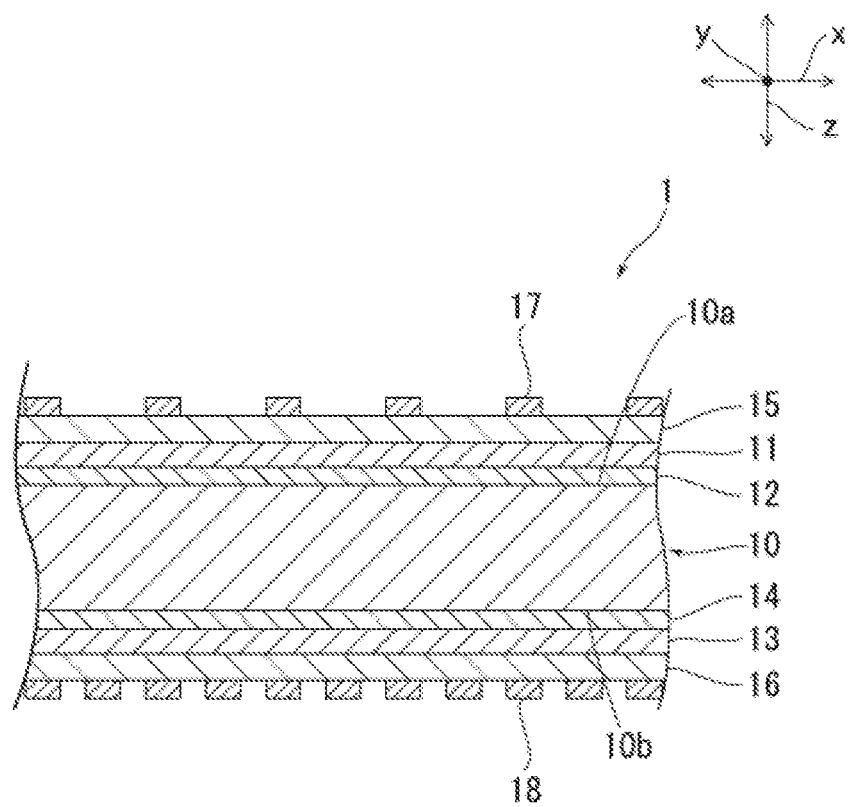
FIG. 1 is a simplified cross-sectional view of a solar cell manufactured in a first embodiment.

The following is an explanation of examples of preferred embodiments of the present invention. The following embodiments are merely examples. The present invention is not limited to the following embodiments in any way.

Further, in each of the drawings referenced in the embodiments, members having substantially the same function are denoted by the same symbols. The drawings referenced in the embodiments are also depicted schematically. The dimensional ratios of the objects depicted in the drawings may differ from those of the actual objects. The dimensional ratios of objects may also vary between drawings. The specific dimensional ratios of the objects should be determined with reference to the following explanation.

1st Embodiment

Configuration of Solar Cell 1

FIG. 1 is a simplified cross-sectional view of a solar cell manufactured in a first embodiment. First, the configuration of the solar cell manufactured in the present embodiment will be explained with reference to FIG. 1.

The solar cell 1 includes a semiconductor substrate 10. The semiconductor substrate 10 can be a single-crystal semiconductor substrate or a polycrystalline semiconductor substrate. More specifically, the semiconductor substrate 10 can be composed, for example, of a single-crystal silicon substrate.

In the explanation of the present embodiment, the semiconductor substrate 10 has n-type conductivity. However, the present invention is not restricted to this. The semiconductor substrate 10 may have p-type conductivity.

A p-type semiconductor layer 11, which has a different type of conductivity from the semiconductor substrate 10, is arranged on the first main surface 10a of the semiconductor substrate 10. The p-type semiconductor layer 11 can be composed, for example, of a p-type non-single-crystal silicon semiconductor such as p-type amorphous silicon. The p-type semiconductor layer 11 preferably contains hydrogen. The thickness of the p-type semiconductor layer 11 is preferably from 3 nm to 20 nm, and more preferably from 5 nm to 15 nm.

An i-type semiconductor layer 12 is arranged between the first main surface 10a of the semiconductor substrate 10 and the p-type semiconductor layer 11. The i-type semiconductor layer 12 can be composed of, for example, a substantially intrinsic non-single-crystal silicon semiconductor such as i-type amorphous silicon. The i-type semiconductor layer 12 preferably contains hydrogen. The i-type semiconductor layer 12 is preferably of a thickness that does not substantially contribute to the generation of electricity. The thickness of the i-type semiconductor layer 12 is preferably from 3 nm to 15 nm, and more preferably from 5 nm to 10 nm.

Meanwhile, an n-type semiconductor layer 13, which has the same type of conductivity as the semiconductor substrate 10, is arranged on the second main surface 10b of the semiconductor substrate 10. The n-type semiconductor layer 13 can be composed, for example, of an n-type non-single-crystal silicon semiconductor such as n-type amorphous silicon. The n-type semiconductor layer 13 preferably contains hydrogen. The thickness of the n-type semiconductor layer 13 is preferably from 3 nm to 25 nm, and more preferably from 5 nm to 15 nm.

An i-type semiconductor layer 14 is arranged between the second main surface 10b of the semiconductor substrate 10 and the n-type semiconductor layer 13. The i-type semiconductor layer 14 can be composed of, for example, a substantially intrinsic non-single-crystal silicon semiconductor such as i-type amorphous silicon. The i-type semiconductor layer 14 is preferably of a thickness that does not substantially contribute to the generation of electricity. The i-type semiconductor layer 14 preferably contains hydrogen. The thickness of the i-type semiconductor layer 14 is preferably from 3 nm to 15 nm, and more preferably from 5 nm to 10 nm.

Transparent conductive oxide (TCO) layers 15, 16 are arranged on the semiconductor layers 11, 13. The p-side electrode 17 is arranged on TCO layer 15. Holes are collected by the p-side electrode 17. The n-side electrode 18 is arranged on TCO layer 16. Electrons are collected by the n-side electrode 18.

Manufacturing Method for Solar Cell 1

The following is an explanation of an example of a manufacturing method for a solar cell 1.

First, the i-type semiconductor layers 12, 14 are formed on the semiconductor substrate 10. Then, the p-type semiconductor layer 11 is formed on i-type semiconductor layer 12, and the n-type semiconductor layer 13 is formed on i-type semiconductor layer 14. The i-type semiconductor layers 12, 14, the p-type semiconductor layer 11, and the n-type semiconductor layer 13 can be formed, for example using a deposition method such as the sputtering method or chemical vapor deposition (CVD).

Next, in a vacuum chamber, hydrogen radical treatment is performed without using ions on at least one of the p-type semiconductor layer 11 and the n-type semiconductor layer 13. More specifically, the hydrogen radical treatment without using ions is performed using the remote plasma method, the catalytic chemical vapor deposition method (Cat-CVD), or the hot wire method. The p-type semiconductor layer 11 and the n-type semiconductor layer 13 are modified in this way. More specifically, the bonded states, etc., of the hydrogen in the p-type semiconductor layer 11 and the n-type semiconductor layer 13 are modified. In the modification step, hydrogen may be introduced to the p-type semiconductor layer 11 and the n-type semiconductor layer 13. In other words, in the modification step, the hydrogen concentration in the p-type semiconductor layer 11 and the n-type semiconductor layer 13 may be increased.

Preferably, the modification step is performed after the p-type semiconductor layer 11 and the n-type semiconductor layer 13 have been formed but before the layers are exposed to air.

After the modification step has been completed, the semiconductor layers 11, 13 are exposed to air, and TCO layers 15, 16 are formed on top. The TCO layers 15, 16 can be formed using a deposition method such as the sputtering method or the CVD method. The TCO layers 15, 16 may be formed in an aerobic atmosphere.

Finally, the solar cell 1 is completed by forming the p-side electrode 17 and the n-side electrode 18. The electrodes 17, 18 can be formed by applying conductive paste or by using the plating method.

As described above, Patent Document 1 describes a technique of introducing hydrogen to a semiconductor layer in which the semiconductor layer is irradiated with hydrogen atoms accelerated by an electric field to which an acceleration voltage from 1 eV to 5 keV has been applied. As a result of extensive research on this hydrogen introducing technique, the present inventors discovered that the semiconductor layer was damaged by hydrogen ion irradiation during the introduction of hydrogen and that the output characteristics of the resulting solar cell were lowered by this damage. As a result, they conceived the idea of performing hydrogen radical treatment on a semiconductor layer without using ions.

When, in the present embodiment, hydrogen radical treatment is performed on the semiconductor layers 11, 13 without using ions and the semiconductor layers 11, 13 have been modified, unlike a situation in which the semiconductor layers are modified using ion irradiation, damage to the semiconductor layers 11, 13 due to ion irradiation can be suppressed. Therefore, the hydrogen radical treatment without using ions in the present embodiment can suppress damage to the semiconductor layers 11, 13 while modifying the bonding state, etc., of the hydrogen in the semiconductor layers 11, 13. As a result, a solar cell 1 with excellent output characteristics can be manufactured.

From the standpoint of obtaining a solar cell 1 with even better output characteristics, the hydrogen radical treatment without using ions is preferably performed on the p-type semiconductor layer 11 which has a different type of conductivity from the semiconductor substrate 10.

From the standpoint of obtaining a solar cell 1 with still even better output characteristics, the hydrogen radical treatment without using ions is preferably performed on both the p-type semiconductor layer 11 and the n-type semiconductor layer 13.

In the present embodiment, the hydrogen radical treatment without using ions is performed after the semiconductor layers 11, 13 have been formed but before each of the semiconductor layers 11, 13 are exposed to air. This can improve the adhesion of the semiconductor layers 11, 13 to the TCO layers 15, 16, for reasons which are described below. In other words, by performing hydrogen radical treatment without using ions, the surface of the semiconductor layers 11, 13 is activated. When the semiconductor layers 11, 13 are exposed to air in this state, it is believed that a thin oxide film is formed on the surfaces of the semiconductor layers 11, 13 immediately after they are exposed to air. As a result, the surfaces of the semiconductor layers 11, 13 are less likely to be contaminated by organic matter and the like. This is believed to improve the adhesion of the semiconductor layers 11, 13 to the TCO layers 15, 16.

Because a natural oxide film is formed on the surfaces of the semiconductor layers 11, 13 by exposing the surfaces to air after the completion of hydrogen radical treatment without using ions, improvements in passivation characteristics can also be expected.

In the remote plasma method, which is an example of a hydrogen radical treatment without using ions, a device is used which can separate ions from the plasma space using a magnetic field and electric field so that only hydrogen radicals reach the surface of the substrate.

The following is an explanation of another preferred embodiment of the present invention. In the following explanation, members having functions that are substantially similar to members in the first embodiment are denoted by the same reference numbers, and further explanation of these members has been omitted.

2nd Embodiment

Figure 2:
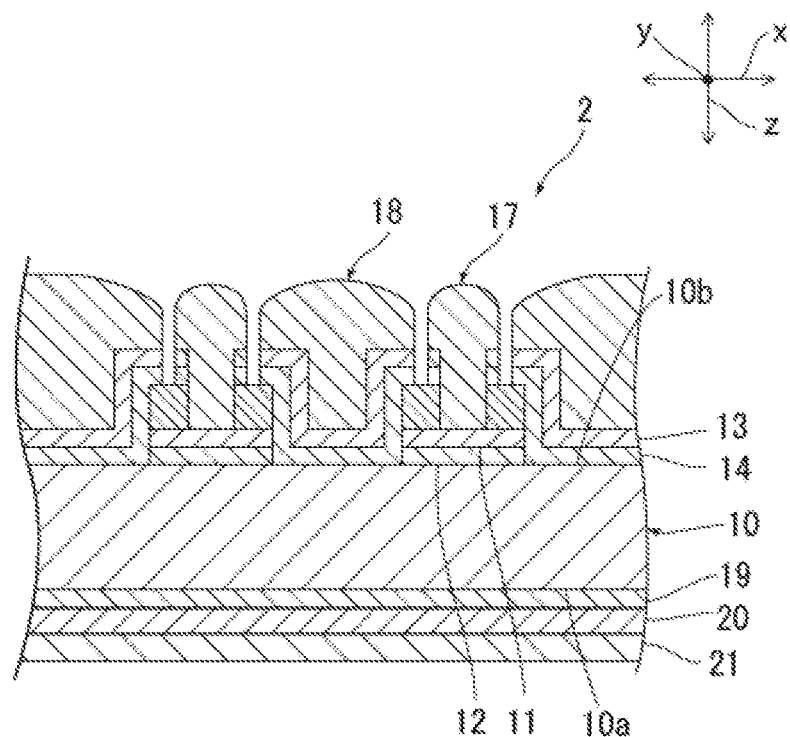
FIG. 2 is a simplified cross-sectional view of a solar cell manufactured in a second embodiment.

FIG. 2 is a simplified cross-sectional view of a solar cell manufactured in a second embodiment.

In the explanation of the example in the first embodiment, a solar cell 1 was manufactured in which a p-type semiconductor layer 11 is formed on the first main surface 10a of the semiconductor substrate 10 and an n-type semiconductor layer 13 is formed on the second main surface 10b. However, the manufacturing method for a solar cell in the present invention can be applied to the manufacture of a solar cell having different aspects. In the example of the present embodiment, the manufacture of a back contact solar cell is explained.

In the solar cell 2 of the second embodiment, as shown in FIG. 2, both the i-type semiconductor layer 12 and the p-type semiconductor layer 11, and the i-type semiconductor layer 14 and the n-type semiconductor layer 13 are formed on the second main surface 10b of the semiconductor substrate 10. An i-type semiconductor layer 19, an n-type semiconductor layer 20, and a protective film 21 with an anti-reflective function are formed in this order on the first main surface 10a of the semiconductor substrate 10.

When this solar cell 2 is manufactured, the hydrogen radical treatment without using ions is performed on at least one of the p-type semiconductor layer 11 and the n-type semiconductor layer 13. In this way, a solar cell 2 with output characteristics as good as those in the first embodiment can also be manufactured in the second embodiment.

The present invention will now be explained in greater detail with reference to specific examples. The present invention is by no means limited to the following examples. Embodiments with many suitable modifications can be obtained without deviating from the spirit of the present invention.

Example 1

A solar cell having a configuration substantially identical to the solar cell 1 in the first embodiment was manufactured under the following conditions using the method explained in the first embodiment.

When a solar cell was manufactured in the first example, hydrogen radical treatment without using ions was performed on the n-type semiconductor layer 13. More specifically, hydrogen gas was introduced at 200 sccm to a depressurized vacuum chamber in a CVD device, and the pressure was reduced to a level from 2 Pa to 10 Pa. Afterwards, from 3.5 kW to 4.0 kW of voltage was applied to the CVD device to generate hydrogen radicals, and the n-type semiconductor layer 13 was irradiated with hydrogen radicals for 40 seconds to perform the hydrogen radical treatment. In the present embodiment, the hydrogen radical treatment was not performed on the p-type semiconductor layer 11.

The open-circuit voltage (Voc), short-circuit current (Isc), fill factor (F.F.) and maximum output (Pmax) of the solar cell manufactured in the first example were measured. The results are shown in Table 1 below.

In the first example, the p-type semiconductor layer 11 was formed to a thickness from 5 nm to 15 nm by introducing a mixture of silane ($SiH_4$) gas (150 sccm), hydrogen ($H_2$) gas (750 sccm) and diborane $B_2H_6$ (5 sccm) to the vacuum chamber of the CVD device, adjusting the pressure to a range from 1 Pa to 5 Pa, and applying voltage in a range from 3.5 kW to 4.0 kW.

In the first example, the n-type semiconductor layer 13 was formed to a thickness from 5 nm to 15 nm by introducing a mixture of silane ($SiH_4$) gas (200 sccm), hydrogen ($H_2$) gas (500 sccm) and phophine ($PH_3$) (5 sccm) to the vacuum chamber of the CVD device, adjusting the pressure to a range from 1 Pa to 5 Pa, and applying voltage in a range from 3.5 kW to 4.0 kW.

Comparative Example 1

A solar cell having a configuration substantially identical to the solar cell 1 in the first example was manufactured in the same way as the first example except that hydrogen radical treatment without using ions was not performed on the p-type semiconductor layer 11 or the n-type semiconductor layer 13.

The open-circuit voltage (Voc), short-circuit current (Isc), fill factor (F.F.) and maximum output (Pmax) of the solar cell manufactured in the first comparative example were measured. The results are shown in Table 1 below.

Example 2

A solar cell having a configuration substantially identical to the solar cell 1 in the first example was manufactured in the same way as the first example except that hydrogen radical treatment without using ions was performed in the same manner as the first example on both the p-type semiconductor layer 11 and the n-type semiconductor layer 13.

The open-circuit voltage (Voc), short-circuit current (Isc), fill factor (F.F.) and maximum output (Pmax) of the solar cell manufactured in the second example were measured. The results are shown in Table 2 below.

The results shown in Table 1 and Table 2 are normalized so that the values for the first comparative example having a p-type semiconductor layer 11 and an n-type semiconductor layer 13 not subjected to hydrogen radical treatment are 100.

TABLE 1

|  | Treatment of n-Type Semiconductor Layer | Voc | Isc | F.F. | Pmax |
|---|---|---|---|---|---|
| Ex. 1 | Ion-Free Hydrogen Radical Treatment | 100 | 100.1 | 100.3 | 100.2 |
| C.E. 1 | None | 100 | 100 | 100 | 100 |

TABLE 2

|  | Treatment of p-Type Semiconductor Layer | Voc | Isc | F.F. | Pmax |
|---|---|---|---|---|---|
| Ex. 2 | Ion-Free Hydrogen Radical Treatment | 102.6 | 100.2 | 100.4 | 103.2 |
| C.E. 1 | None | 100 | 100 | 100 | 100 |

It is clear from the results in Table 1 and Table 2 that performing hydrogen radical treatment without using ions on the p-type semiconductor layer 11 and n-type semiconductor layer 13 improve the output characteristics of a solar cell such as the fill factor and the maximum output compared to a situation in which hydrogen radical treatment without using ions is not performed or a situation in which hydrogen radical treatment using ions is performed.

3rd Embodiment

Configuration of Solar Cell 1

In the third embodiment, reference is made to FIG. 1 as in the case of the first embodiment. The configuration of the solar cell in the third embodiment is identical to the configuration of the solar cell in the first embodiment, so further explanation of this configuration has been omitted.

Manufacturing Method for Solar Cell 1

The following is an explanation of the manufacturing method for the solar cell 1 in an example of the third embodiment.

First, i-type semiconductor layers 12, 14 are formed on the semiconductor substrate 10. The i-type semiconductor layers 12, 14 can be formed using a deposition method such as the chemical vapor deposition (CVD) method or the sputtering method.

Next, hydrogen radical treatment without using ions is performed on at least one of the i-type semiconductor layers 12, 14. More specifically, the hydrogen radical treatment without using ions is performed using the remote plasma method, the catalytic chemical vapor deposition method (Cat-CVD), or the hot wire method. The i-type semiconductor layers 12, 14 are modified in this way. More specifically, the bonded state of the hydrogen and the like in the i-type semiconductor layers 12, 14 are modified. In the modification step, hydrogen may be introduced to the i-type semiconductor layers 12, 14. In other words, in the modification step, the hydrogen concentration in the i-type semiconductor layers 12, 14 may be increased.

Next, a p-type semiconductor layer 11 is formed on the i-type semiconductor layer 12, and an n-type semiconductor layer 13 is formed on the i-type semiconductor layer 14. The p-type semiconductor layer 11 and the n-type semiconductor layer 13 can be formed using a deposition method such as the CVD method or the sputtering method.

Next, TCO layers 15, 16 are formed on the semiconductor layers 11, 13. The TCO layers 15, 16 can be formed using a deposition method such as the sputtering method or the CVD method.

Finally, the solar cell 1 is completed by forming electrode 17 and electrode 18. The electrodes 17, 18 can be formed by applying conductive paste or by using the plating method.

As described above, Patent Document 1 describes a technique of introducing hydrogen to an i-type amorphous silicon layer in which the i-type amorphous semiconductor layer is irradiated with hydrogen atoms accelerated by an electric field to which an acceleration voltage from 1 eV to 5 keV has been applied. As a result of extensive research on this hydrogen introducing technique, the present inventors discovered that the i-type amorphous silicon layer was damaged by hydrogen ion irradiation during the introduction of hydrogen and that the output characteristics of the resulting solar cell were lowered by this damage. As a result, they conceived the idea of performing hydrogen radical treatment on an i-type amorphous silicon layer without using ions.

When, as in the present embodiment, hydrogen radical treatment is performed on the i-type semiconductor layers 12, 14 without using ions and the i-type semiconductor layers 12, 14 have been modified, damage to the i-type semiconductor layers 12, 14 due to ion irradiation can be suppressed, unlike in a situation in which the semiconductor layers are modified using ion irradiation. Therefore, the hydrogen radical treatment without using ions in the present embodiment can suppress damage to the i-type semiconductor layers 12, 14 while modifying the bonding state, etc., of the hydrogen in the i-type semiconductor layers 12, 14. As a result, a solar cell 1 with excellent output characteristics can be manufactured.

From the standpoint of obtaining a solar cell 1 with even better output characteristics, the hydrogen radical treatment without using ions is preferably performed on the both i-type semiconductor layer 12 and i-type semiconductor layer 14.

The following is an explanation of another preferred embodiment of the present invention. In the following explanation, members having functions that are substantially similar to members in the third embodiment are denoted by the same reference numbers and further explanation of these members has been omitted.

4th Embodiment

FIG. 2 is a simplified cross-sectional view of a solar cell manufactured in a fourth embodiment.

In the explanation of the example in the third embodiment, a solar cell 1 was manufactured in which a p-type semiconductor layer 11 is formed on the first main surface 10a of the semiconductor substrate 10, while an n-type semiconductor layer 13 is formed on the second main surface 10b. However, the manufacturing method for a solar cell in the present invention can be applied to the manufacture of a solar cell having different aspects. In the example of the present embodiment, the manufacture of a back contact solar cell is explained.

The configuration of the solar cell in the fourth embodiment is identical to the configuration of the solar cell in the first embodiment shown in FIG. 2, so further explanation of this configuration has been omitted.

When the solar cell 2 is manufactured, at least one of the i-type semiconductor layers 12, 14 is subjected to hydrogen radical treatment without using ions in order to modify the i-type semiconductor layer or layers 12, 14. In this way, a solar cell 2 can be manufactured in the second embodiment with excellent output characteristics similar to those in the first embodiment.

The present invention will now be explained in greater detail with reference to specific examples. The present invention is by no means limited to the following examples. Embodiments with many suitable modifications can be obtained without deviating from the spirit of the present invention.

Example 3

A solar cell having a configuration substantially identical to the solar cell 1 in the third embodiment was manufactured under the following conditions using the method explained in the third embodiment.

When a solar cell was manufactured in the third example, hydrogen radical treatment without using ions was performed on i-type semiconductor layer 12. More specifically, hydrogen gas was introduced at 500 sccm to a depressurized vacuum chamber in a CVD device, and the pressure was reduced to a level from 2 Pa to 10 Pa. Afterwards, from 3.5 kW to 4.0 kW of voltage was applied to the CVD device to generate hydrogen radicals, and i-type semiconductor layer 12 was irradiated with hydrogen radicals for 20 seconds to perform the hydrogen radical treatment. In the present embodiment, the hydrogen radical treatment was not performed on i-type semiconductor layer 14.

Also, in the third example, the i-type semiconductor layer 12 was formed to a thickness of 10 nm by introducing a mixture of silane ($SiH_4$) gas (200 sccm) and hydrogen ($H_2$) gas (100 sccm) to the vacuum chamber of the CVD device, adjusting the pressure to a range from 1 Pa to 5 Pa, and applying voltage in a range from 3.5 kW to 4.0 kW.

The open-circuit voltage (Voc), short-circuit current (Isc), fill factor (F.F.) and maximum output (Pmax) of the solar cell manufactured in the third example were measured. The results are shown in Table 3 below.

The open-circuit voltage (Voc), short-circuit current (Isc), fill factor (F.F.) and maximum output (Pmax) of the solar cell manufactured in the first comparative example were measured. The results are shown in Table 3 below.

The results shown in Table 3 are normalized so that the values for the first comparative example having an i-type semiconductor layer 12 not subjected to hydrogen radical treatment are 100.

TABLE 3

| | Treatment of i-Type Semiconductor Layer | Voc | Isc | F.F. | Pmax |
|---|---|---|---|---|---|
| Ex. 3 | Ion-Free Hydrogen Radical Treatment | 100 | 100 | 101.3 | 101.2 |
| C.E. 1 | None | 100 | 100 | 100 | 100 |

It is clear from the results in Table 3 that performing hydrogen radical treatment without using ions on the i-type semiconductor layers 12, 14 improves the output characteristics of a solar cell such as the fill factor and the maximum output compared to a situation in which hydrogen radical treatment without using ions is not performed or a situation in which hydrogen radical treatment using ions is performed.

5th Embodiment

Configuration of Solar Cell 1

In the fifth embodiment, reference is made to FIG. 1 as in the case of the first embodiment. The configuration of the solar cell in the fifth embodiment is identical to the configuration of the solar cell in the first embodiment, so further explanation of this configuration has been omitted.

Manufacturing Method for Solar Cell 1

The following is an explanation of an example of a manufacturing method for the solar cell 1.

1st Fixing Step

Figure 3:
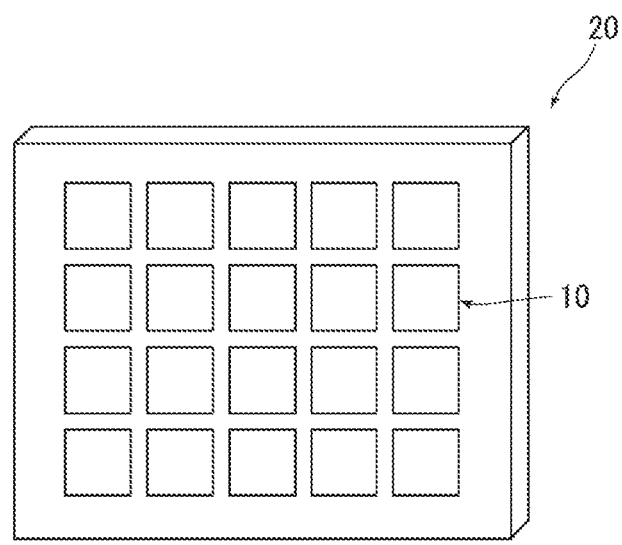
FIG. 3 is a simplified perspective view of a tray to which the semiconductor substrate has been fixed.

First, as shown in FIG. 3, a plurality of semiconductor substrates 10 is fixed to a tray 20. The tray 20 can be a plate-shaped object made, for example, of stainless steel (SUS). The semiconductor substrates 10 can be fixed by using the tray 20 and a mask (not shown) to press on the peripheral edges of the semiconductor substrates 10 from the front and back surfaces of the semiconductor substrates 10.

Semiconductor Layer Forming Step

Next, an i-type semiconductor layer 14 and an n-type semiconductor layer 13 are formed on the semiconductor substrates 10 fixed to the tray 20. Afterwards, an i-type semiconductor layer 12 and a p-type semiconductor layer 11 are formed on the surface of the semiconductor substrates 10 opposite to the n-type semiconductor layer 13. The i-type semiconductor layers 12, 14, the p-type semiconductor layer 11 and the n-type semiconductor layer 13 can be formed using a deposition method such as the chemical vapor deposition (CVD) method or the sputtering method.

Irradiation Step

After the semiconductor layers 11-14 have been formed, the tray 20 in which the semiconductor substrates 10 are still fixed is irradiated with at least one of hydrogen radicals and hydrogen ions.

Removal Step

Next, the semiconductor substrates 10 are removed from the tray 20.

(Transparent Conductive Oxide (TCO) Forming Step

Next, the TCO layers 15, 16 are formed. The TCO layers 15, 16 can be formed using a deposition method such as the sputtering method or the CVD method.

The TCO layer forming step may be performed before the removal step. In other words, the TCO forming step may be performed when the semiconductor substrates 10 are still fixed to the tray 20.

Electrode Forming Step

Next, the solar cells 1 can be completed by forming electrode 17 and electrode 18. The electrodes 17, 18 can be formed by applying conductive paste or by using the plating method.

2nd Fixing Step

After the removal step, new semiconductor substrates 10 on which semiconductor layers 11-14 have not been formed are fixed to the tray 20 from which the semiconductor substrates 10 were removed in the removal step.

In the present embodiment, solar cells 1 are manufactured by repeating the second fixing step, the semiconductor layer forming step, the irradiation step, the removal step, the TCO layer forming step, and the electrode forming step.

In the fifth embodiment, the semiconductor layer forming step is performed to form semiconductor layers doped with dopant, and then the irradiation step is performed to irradiate the tray 20 with at least one of hydrogen radicals and hydrogen ions. As a result, solar cells 1 with improved output characteristics can be manufactured efficiently, for reasons which are described below. In the step in which the p-type semiconductor layer and n-type semiconductor layer doped with a dopant are formed on the semiconductor substrates, a semiconductor layer doped with dopant is also formed on the tray and on the mask (not shown). When the tray is reused and an i-type semiconductor layer is formed, the dopant in the semiconductor layers formed on the tray dopes the i-type semiconductor layer. As a result, the output characteristics of the resulting solar cells decline. However, in the present embodiment, the dopant is released from the semiconductor layer formed on the tray during the irradiation step when the tray is irradiated with at least one of hydrogen radicals and hydrogen ions. This can reduce the concentration of dopant in the semiconductor layer formed on the tray. When the tray is reused, the doping of the i-type semiconductor layer with dopant contained in the semiconductor layer formed on the tray can be suppressed. As a result, solar cells with excellent output characteristics can be manufactured.

In the fifth embodiment, the irradiation step is performed before the removal step. As a result, the semiconductor layers 11, 13 are also irradiated with at least one of hydrogen radicals and hydrogen ions. Thus, the semiconductor layers 11, 13 are modified. More specifically, the bonding state, etc., of the hydrogen contained in the semiconductor layers 11, 13 is modified. As a result, solar cells with even better output characteristics can be manufactured.

From the standpoint of obtaining a solar cell 1 with even better output characteristics, the irradiation step preferably consists of performing a hydrogen radical treatment that does not use ions on the semiconductor layers 11, 13. This is believed to yield solar cells with even better output characteristics because damage to the semiconductor layers 11, 13 by hydrogen ions can be suppressed. The hydrogen radical treatment without using ions can be performed using the remote plasma method, the catalytic chemical vapor deposition method (Cat-CVD), or the hot wire method.

By performing the irradiation step before the removal step, the ohmic characteristics between the semiconductor layers 11, 13 and the TCO layers 15, 16 can be improved. As a result, solar cells with even better output characteristics can be obtained. This is believed to occur because the dopant released from the semiconductor layer formed on the tray 20 in the irradiation step adheres to the surface of the semiconductor layers 11, 13, which increases the concentration of dopant in the surface layer of the semiconductor layers 11, 13.

The manufacturing method for a solar cell in the present invention can be applied to any type of solar cell as long as the solar cell has an i-type semiconductor layer and a semiconductor layer doped with dopant. For example, the manufacturing method for a solar cell in the present invention can be applied to back contact solar cells and to thin-film solar cells.

In the explanation of the example of a fifth embodiment, the removal step was performed after the irradiation step. However, the removal step may be performed before the irradiation step.

Also, when more than one semiconductor layer doped with dopant is formed, the irradiation step should be performed after at least one of the semiconductor layers doped with dopant has been formed. The irradiation step does not have to be performed after all of the semiconductor layers doped with dope have been formed.

In the present invention, the substrate is not restricted to a semiconductor substrate.

The present invention will now be explained in greater detail with reference to specific examples. The present invention is by no means limited to the following examples. Embodiments with many suitable modifications can be obtained without deviating from the spirit of the present invention.

Example 4

Solar cells having a configuration substantially identical to the solar cell 1 in the fifth embodiment were manufactured under the following conditions using the method explained in the previous embodiment. More specifically, the p-type semiconductor layer 11 was formed after the n-type semiconductor layer 13 had been formed. Afterwards, the irradiation step was performed.

More specifically, hydrogen gas was introduced at 200 sccm to a depressurized vacuum chamber in a CVD device, and the pressure was reduced to a level from 2 Pa to 10 Pa. Afterwards, from 3.5 kW to 4.0 kW of voltage was applied to the CVD device to generate hydrogen radicals, and the p-type semiconductor layer 11 was irradiated with hydrogen radicals for 40 seconds to perform the hydrogen radical treatment.

The open-circuit voltage (Voc), short-circuit current (Isc), fill factor (F.F.) and maximum output (Pmax) of the solar cell manufactured in the fourth example were measured. The results are shown in Table 4 below.

In the fourth example, the p-type semiconductor layer 11 was formed to a thickness from 5 nm to 15 nm by introducing a mixture of silane ($SiH_4$) gas (150 sccm), hydrogen ($H_2$) gas (750 sccm) and diborane (B2H6) (5 sccm) to the vacuum chamber of the CVD device, adjusting the pressure to a range from 1 Pa to 5 Pa, and applying voltage in a range from 3.5 kW to 4.0 kW.

Example 5

Solar cells were manufactured in the same manner as the fourth example except that the n-type semiconductor layer 13 was formed, the irradiation step was then performed, the p-type semiconductor layer 11 was formed, and the irradiation step was then not performed.

The open-circuit voltage (Voc), short-circuit current (Isc), fill factor (F.F.) and maximum output (Pmax) of the solar cell manufactured in the fifth example were measured. The results are shown in Table 4 below.

The open-circuit voltage (Voc), short-circuit current (Isc), fill factor (F.F.) and maximum output (Pmax) of the solar cell manufactured in the first comparative example were measured. The solar cell in the first comparative example was created after the second fixing step had been performed.

The results are shown in Table 4 below. The results shown in Table 4 were normalized so that the values for the first comparative examples are 100.

TABLE 4

|        | Voc   | Isc   | F.F.  | Pmax  |
|--------|-------|-------|-------|-------|
| Ex. 4  | 0.999 | 1.001 | 1.003 | 1.002 |
| Ex. 5  | 1.026 | 1.002 | 1.004 | 1.032 |
| C.E. 1 | 100   | 100   | 100   | 100   |

From the results shown in Table 4, it is clear that a solar cell with excellent output characteristics can be manufactured by performing the irradiation step after the semiconductor layer formation step.

KEY TO THE DRAWINGS 1, 2: Solar cell
10: Semiconductor substrate
10a: 1st main surface
10b: 2nd main surface 11: p-type semiconductor layer
12, 14: i-type semiconductor layer
13: n-type semiconductor layer
15, 16: TCO layer
17: p-side electrode
18: n-side electrode
20: Tray

What is claimed is:

1. A manufacturing method for a plurality of solar cells, the method comprising:
    first fixing a semiconductor substrate to a tray;
    forming an amorphous silicon layer at least a part of which is doped with a dopant on the semiconductor substrate fixed to the tray;
    after forming the amorphous silicon layer, irradiating the tray with hydrogen radicals without using ions and thereby irradiating the amorphous silicon layer formed on the semiconductor substrate that is fixed on the tray with the hydrogen radicals without using ions;
    removing the semiconductor substrate having the irradiated amorphous silicon layer thereon from the tray after the irradiating;
    forming a transparent conductive layer on the irradiated amorphous silicon layer on the semiconductor substrate that is removed from the tray, after removing the semiconductor substrate; and
    second fixing, to the tray from which the semiconductor substrate is removed, a new semiconductor substrate,
    wherein for each new semiconductor substrate, second fixing a new semiconductor substrate to the tray; forming, after the second fixing, an amorphous silicon layer on the new semiconductor substrate; irradiating, after forming the amorphous silicon layer, the tray with hydrogen radicals; removing, after the irradiating, the new semiconductor substrate from the tray; and forming, after removing the new semiconductor substrate, a transparent conductive layer on the irradiated amorphous silicon layer on the new semiconductor substrate, are executed while the tray is reused.

2. The manufacturing method for a solar cell according to claim 1, wherein the semiconductor substrate has one type of conductivity, and
    the amorphous silicon layer includes: a first semiconductor layer having the one type of conductivity arranged on one main surface of the semiconductor substrate; a second semiconductor layer having the other type of conductivity arranged on the one main surface of the semiconductor substrate.

3. The manufacturing method according to claim 2, wherein
    the first semiconductor layer comprises an i-type amorphous silicon layer on the semiconductor substrate and an amorphous silicon layer having the one type of conductivity being doped with the dopant on the i-type amorphous silicon layer, and
    the second semiconductor layer comprises an i-type amorphous silicon layer on the semiconductor substrate and an amorphous silicon layer having the other type of conductivity being doped with the dopant on the i-type amorphous silicon layer.

4. The manufacturing method according to claim 1, wherein
    forming the amorphous silicon layer comprises forming the amorphous silicon layer by forming an i-type amorphous silicon layer on the semiconductor substrate fixed to the tray and forming the amorphous silicon layer being doped with the dopant on the i-type amorphous silicon layer.

* * * * *